(12) United States Patent
Mullis

(10) Patent No.: US 6,527,927 B1
(45) Date of Patent: Mar. 4, 2003

(54) VACUUM TREATMENT SYSTEM

(75) Inventor: Felix Mullis, Flums (CH)

(73) Assignee: Unaxis Balzers Aktiengesellschaft, Balzers (LI)

( * ) Notice: Subject to any disclaimer, the term of this patent is extended or adjusted under 35 U.S.C. 154(b) by 26 days.

(21) Appl. No.: 09/587,452

(22) Filed: Jun. 5, 2000

Related U.S. Application Data

(63) Continuation of application No. PCT/CH98/00548, filed on Dec. 22, 1998.

(30) Foreign Application Priority Data

Dec. 23, 1997 (CH) .............................................. 2958/97

(51) Int. Cl.[7] .......................... C23C 14/34; C23C 16/00
(52) U.S. Cl. ........................ 204/298.03; 204/192.13; 118/728; 118/663; 118/665; 118/666; 118/668; 118/669; 118/671; 118/675; 156/345.24; 156/345.25; 156/345.26; 156/345.27; 156/345.28
(58) Field of Search ................... 204/192.13, 298.03; 118/728, 663, 665, 666, 668, 669, 671, 675; 156/345.24, 345.25, 345.26, 345.27, 345.28

(56) References Cited

U.S. PATENT DOCUMENTS 4,407,708 A * 10/1983 Landau .................. 204/192.13
4,409,087 A * 10/1983 Quick .................... 204/298.03
4,579,639 A * 4/1986 Enomoto et al. ....... 204/192.13
4,913,790 A * 4/1990 Narita et al. ........... 204/192.13
5,292,417 A * 3/1994 Kugler ................... 204/192.13
5,365,147 A  11/1994 Shinohara et al. ....... 315/111.21

FOREIGN PATENT DOCUMENTS

DE      4203672     4/1993
EP      0467391     1/1992

OTHER PUBLICATIONS

J. Laimer, *Plasmaunterstützte. . .*, Dec. 1987.

M. Konuma, *Film Deposition by Plasma Techniques*, 1992.

* cited by examiner

*Primary Examiner*—Rodney G. McDonald
(74) *Attorney, Agent, or Firm*—Notaro & Michalos P.C.

(57) ABSTRACT

A vacuum treatment system in which a part (9) is provided inside a vacuum treatment chamber (1). A potential ($\phi_9$) which deviates from the system reference potential ($\phi_0$) by approximately at least ±12 V is applied to said part. A sensor and/or an actuator (11) is/are arranged on said part. In addition, the invention comprises an electronic unit (13) which is connected to the sensor and/or actuator. Processing signals on the unit (13) is considerably simplified in that the electronic unit (13) is operated as a reference potential on the potential ($\phi_9$) of said part (9).

30 Claims, 5 Drawing Sheets

VACUUM TREATMENT SYSTEM

CROSS REFERENCE TO RELATED APPLICATION

This is a continuation application of PCT/CH98/00548, filed Dec. 22, 1998.

FIELD AND BACKGROUND OF THE INVENTION

The present invention relates to a vacuum treatment system with at least one vacuum treatment chamber, wherein a first part of the system is connected with an electrical system reference potential—by convention ground potential; in the vacuum chamber a further part is provided to which is applied an electric potential varying by at least ±12 V from the system reference potential, and wherein at this further part at least one sensor and/or at least one adjusting element is disposed, further with an electronics unit which is operatively connected at the input and/output side with the sensor and/or adjusting element.

Such a prior known vacuum treatment system is depicted schematically in FIG. 1 as an example with a path of plasma discharge and will be discussed in conjunction with this Figure. In the vacuum chamber 1 a plasma discharge path is provided in this example between electrodes $3_a$ and $3_b$. The discharge path denoted by 3 is operated electrically by a supply unit 5, with this being either DC, pulsed DC, with AC or with AC and superimposed DC, wherein the AC signal frequency can be in the Hz up to the high frequency, for example even in the microwave range.

For the purpose of explanation, in FIG. 1 the electrical supply leads to the discharge path 3 from the chamber 1 are shown as being electrically insulated. Different ways exist of superimposing the system reference potential, by convention ground potential $\phi_0$. This is schematically shown by the option selection switch 7. It is conventional, for example, to put the housing 1 as well as one of the electrodes $3_a$, $3_b$ at ground. In the vacuum chamber 1 a further part 9 is depicted, for example a substrate support, an instrument support, a further electrode etc., wherein this part 9, shown separately for the purpose of the explanation, can also be one of the electrodes $3_a$, $3_b$. This part 9 is now not at potential $\phi_0$. This is shown with the unit 4 according to an impedance and/or source equivalent circuit diagram.

SUMMARY OF THE INVENTION

The present invention builds on problems in connection with part 9 in the chamber 1 to which (part) the system reference potential $\phi_0$ is not applied. It is at any electrical potential $\phi_9$ varying decisively, i.e. by at least ±12 V, from $\phi_0$, i.e. it is at DC potential, AC potential, at superimposed AC and DC potential, at a pulsed DC potential, wherein in terms of frequency the AC potential can be launched up into the high-frequency range or even into the microwave range. If, for example, part 9 is a substrate support, it can, if mounted electrically insulated, be operated with respect to $\phi_0$, on self-bias potential of the discharge. If part 9 is one of the electrodes $3_a$, $3_b$ in the case of plasma generation, it is at high HF potential with respect to $\phi_0$.

As shown further in FIG. 1, it is frequently necessary to carry out measurements or adjusting intervention at said part 9, not operated at system reference potential $\phi_0$, as is schematically shown on unit 11, by means of at least one sensor and/or at least one adjusting element. Adjusting signals or sensor output signals are transmitted from an electronics unit 13 to the unit 11 or received by the latter. As shown in FIG. 1, it is conventional to apply to such an electronics unit 13 the system reference potential $\phi_0$. Such an electronics unit is often

- a digital, programmable unit with storage means for the operating programs, therein preferably comprising
- at least one programmable digital logic package and/or
- a digital computing unit,
- it preferably comprises a microprocessor and/or a microcomputer with associated storage means for operating programs.

The reason for the reference potential placement comprises that for example with HF operation of the discharge path, simple protective measures are possible, as shown schematically at 15, for example by means of shielding also placed at $\phi_0$. Furthermore, the signal communication between unit 13 and a unit 17 supervisory to it, such as for example a supervisory computer, is especially simple. The communication interface 19 comprises as reference potential the system reference potential $\phi_0$ which, as stated, is by convention ground potential. Under the assumption of the communication connection between unit 11 and unit 13, which is schematically shown by 21 in FIG. 1, also, if appropriate, feed signals for unit 11 from an external feed device, the supplied voltages to unit 11 are reduced through suitable electronic means to the measuring or total adjusting range of by convention a few volts. For this purpose are used, for example, voltage dividers, as described in U.S. Pat. No. 5,270,637, and/or suitable rectifiers and filter elements, as shown in U.S. Pat. No. 5,144,231.

This prior known configuration entails problems:

Measuring and adjusting signals from respectively to the unit 11 must be isolated from often large "Common Mode" signals, namely from the signal, already mentioned, between part 9, $\phi_0$ and $\phi_9$. This entails expenditures in particular if part 9 is at HF potential, in particular high HF potential, or at a potential with high spectral components of higher frequencies, such as occur during pulse operation, interference spark formation, switch-on processes etc. But even if the part 9 were at an ideal DC potential with respect to $\phi_0$, the problem remains that on unit 11 relatively small measuring or adjusting signals with respect to a large "Common Mode" signal must be processed which strongly limits the accuracy or resolution of said measuring or adjusting signals. If part 9 is operated for example at HF potential, for each individual measuring or control line from, respectively to, the unit 11 an HF filter must be provided—with, depending on the expenditure, restricted effect—as well as for each additional signal, such as for example for feed signals to unit 11 in order to ensure an optimal HF uncoupling with respect to the electronic unit 13. This entails considerable expenditures. In addition, in particular measuring and control signal lines to unit 11 must be efficiently shielded, especially if the, by convention, high-ohmic and sensitive inputs of unit 13 are taken into consideration. In principle, expensive precautionary measures for protecting the electronics must be provided.

It is the task of the present invention to develop a vacuum treatment system of the discussed type such that a substantial simplification of the signal processing with the electronic unit 13 results, further a more accurate measurement signal evaluation or a more precise adjusting element variation and which is significantly more cost effective. This is attained thereby that the electronics unit, differing from the prior known technique described in conjunction with FIG. 1, is operated at a further reference potential which further reference potential is equal to the potential of the further part 9.

The potential placement is especially highly effective with low expenditure where the operation of the vacuum treatment system leads to the occurrence of, to some extent stochastic, high-frequency signal components. A vacuum treatment system in which such processes occur frequently is in particular a system in which a discharge path is used.

In such a system said further part 9 forms preferably one of the discharge electrodes or is a part exposed to the discharge operated at a floating potential and thus, for example assumes the self-bias potential of the discharge or which is operated tied in potential.

In a further preferred embodiment, therein in particular in said system with discharge path, said at least one sensor is a temperature sensor, the adjusting element is a heating and/or cooling device, therein preferably a multizone heating or cooling device, wherein further, preferred in this case, the further part 9 is formed by a workpiece support. A temperature control can therein be realized or, preferably, a temperature regulation. The sensor or a multiplicity of provided sensors acquires the regulation parameters, temperature or temperature distribution. At the electronics unit, at the potential of part 9, either the regulating parameter measuring signal is amplified and supplied at the output side on a higher level insensitive to higher interference variables to a supervisory unit, at which a SET/INSTANTANEOUS value comparison takes place and at which, if appropriate, also the regulator is realized with the desired characteristic. The fed-back signal is supplied from the supervisory unit to said electronics unit on part 9, which outputs the temperature or temperature distribution actuator signal to the temperature adjusting element(s). Otherwise, the electronics unit preferably forms directly the SET/INSTANTANEOUS value comparison and the desired regulator characteristic.

In this approach temperature accuracies of at least ±5° C. in total adjusting ranges of a few 100° C. full scale can readily be achieved, preferably of at least ±2° C. or even of at least ±1° C. Such a temperature control or guidance accuracy did present large problems in known processes according to FIG. 1.

Such a temperature guidance is in particular highly desired if said part 9 is a workpiece support in the system or if part 9 is a target configuration of the system.

In a further preferred embodiment, said part 9 forms a workpiece holding fixture. The sensor verifies the presence or absence of a workpiece on the holding fixture. If the workpiece holding fixture forming said part 9 comprises a holding element acting electrostatically or by underpressure onto the workpiece, said sensor or a further sensor is preferably provided for verifying the workpiece mounting, and preferably a feedback from the sensor via the electronics unit onto said mounting is carried out.

Consequently it is possible to verify the adhesion condition or the mounting of the workpieces in the chamber and, if necessary, to readjust or reregulate them.

In a further preferred embodiment of the system said further part 9 is provided directly in the region of a gas inlet into the vacuum chamber and the sensor is developed as a gas flow sensor. The electronics unit acts at the output side onto an adjusting valve configuration in a gas guidance for the gas inlet.

Alternatively, in the last described process, said part 9 is provided in the immediate region of a workpiece. In this way it is possible in any event to carry out a precise gas inlet control or regulation directly at the location of the critical event which permits without delay the fast and precise response to instantaneous operation conditions variation from the set operation.

As already indicated on a further preferred embodiment the further part 9 is provided on a target configuration, where the sensor measures or detects the temperature of the target and/or its condition. In spite of difficult electrical situations in the environment of the target (through transients, for example triggered through interference sparking), through the process according to the invention it is possible, to detect with high accuracy target temperatures or generally target conditions such as for example its erosion mass and to carry out control or regulatory interventions via the electronics unit.

Said electronics unit operated at the potential of part 9 can therein be provided quite outside of the vacuum chamber; but at least its input stage for the sensor or output stage for the adjusting element are preferably disposed in the immediate region of said sensors or adjusting elements and thus in the vacuum chamber.

In a further preferred embodiment of the system according to the invention the further part 9 is at an AC and/or DC potential with respect to the system reference potential or is disposed such that it is electrically insulated from the system reference potential. AC comprises therein in particular the HF range, but can extend up into the microwave range. The further part is preferably a substrate or workpiece support. In particular in that case the provision of sensors and/or adjusting elements, such as for example for the described temperature setting or regulation, is often desired.

If the further part is at an HF potential with respect to the system reference potential, also, for example for bias operation relative to a plasma, thus preferably in a frequency range of 100 kHz to 100 MHz, therein preferably between 5 MHz and 50 MHz, therein preferably between 5 MHz and 50 MHz, in particular preferred at the industrial frequency of approximately 13.56 MHz. The potential difference $\phi_0-\phi_9$, is further preferably as follows:

$$|\pm 12|V \leq |\phi_0-\phi_9| \leq |\pm 2000|V,$$

preferably $$|\pm 25|V \leq |\phi_0-\phi_9| \leq |\pm 500|V.$$

Peak-to-peak voltage $V_{pp}$ on said part 9 and with respect to system reference potential at AC, in particular HF operation, are preferably in the range $$25V \leq V_{pp} \leq 200V,$$

therein preferably:

$$50V \leq V_{pp} \leq 500V.$$

In a further preferred embodiment said electronics unit comprises at least one digital, preferably programmable unit, preferably at least one programmable digital logic package and/or at least one digital computing unit, preferably at least one microprocessor and/or microcomputer. If required, at the electronics unit are preferably provided storage means for operating programs.

Further preferred, the electronics unit is mechanically disposed directly on said further part 9. In particular in the case the further part 9 is at an HF potential, said electronics unit is preferably encompassed by a Faraday cage which is preferably at the potential of part 9. It is further preferably proposed that the connections from and/or to the electronics unit are carried at least to some extent over galvanic isolation sites and/or over HF filter configurations. Such filter configurations are therein preferably encompassed by a Faraday cage configuration placed at the system reference potential.

In a preferred embodiment said electronics unit communicates with a supervisory adjusting and/or monitoring unit, for example a host computer disposed outside of the vacuum chamber. Signal connections between the electronics unit and the supervisory unit preferably take place via a galvanic isolation site such as over ratio transformers, preferably via light waveguides.

BRIEF DESCRIPTION OF THE DRAWINGS

In the following the invention will be explained by example in conjunction with Figures. Therein depict.

DESCRIPTION OF THE PREFERRED EMBODIMENTS

Figure 1:
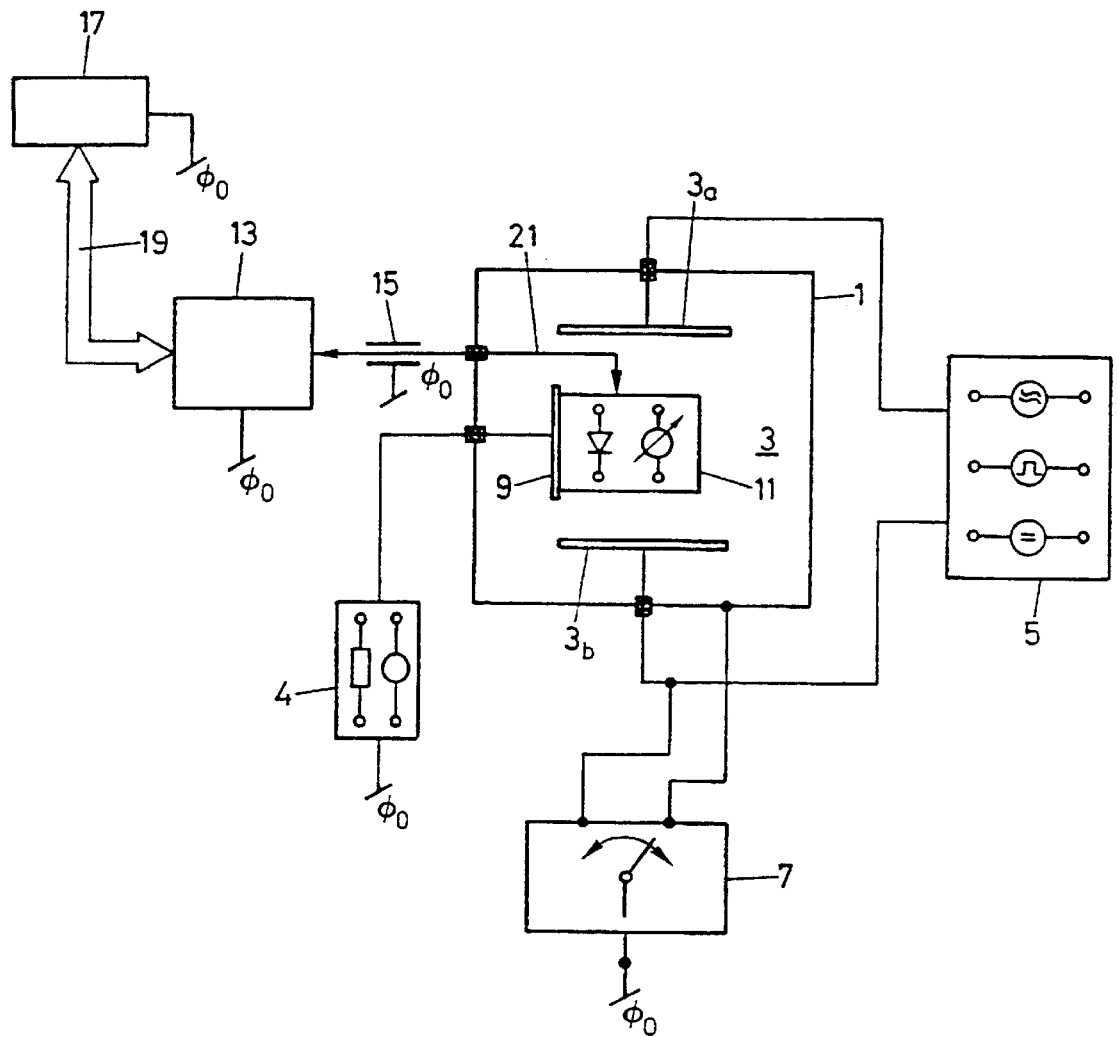
FIG. 1 schematically the electrical situation of interest in the case of prior known vacuum treatment systems, FIG. 2 in schematic representation analogously to FIG. 1 a vacuum treatment system according to the invention, FIG. 3 schematically a preferred embodiment of the further part developed as substrate support of an HF plasma vacuum treatment system, FIG. 4 schematically a first temperature distribution regulation according to the invention, FIG. 5 a second temperature distribution regulation according to the invention, and, FIG. 6 shown schematically, a gas flow control or regulation according to the invention.
Figure 2:
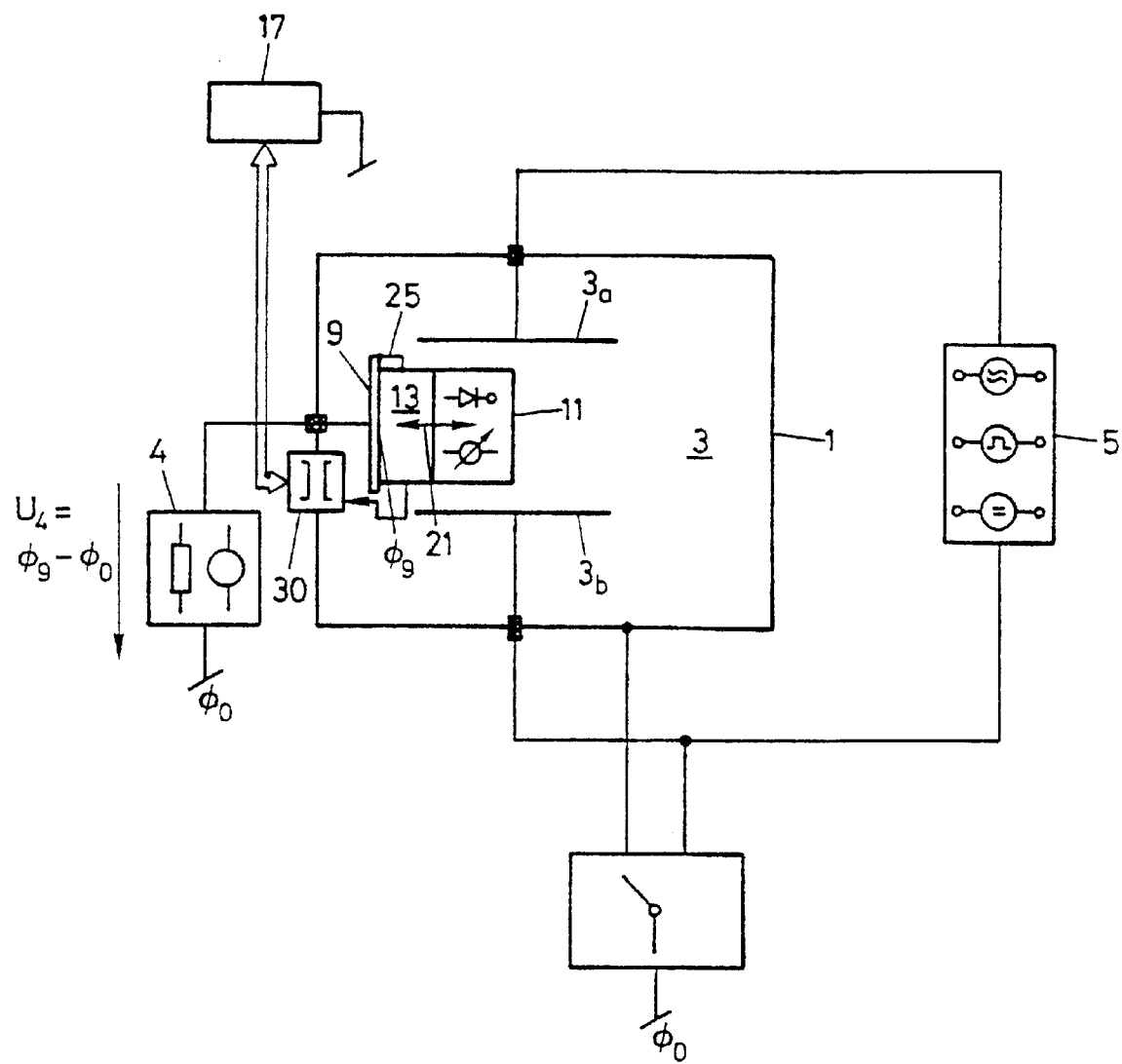

In FIG. 2 the parts explained already in conjunction with FIG. 1 are denoted by the same symbols as in FIG. 1. Part 9 which, as has already been explained in conjunction with FIG. 1, can fundamentally be a part not at the system potential $\phi_0$, thus can also be one of the electrodes $3_a$, $3_b$, is, as shown schematically in unit 4, via an impedance and/or a signal source configuration (equivalent net option) referred to system reference potential $\phi_0$. In contrast to prior known systems according to FIG. 1, primarily as the reference potential of the electronics unit 13, as represented with the galvanic connection 25, the potential $\phi_9$ is superimposed on part 9. It is preferred but not absolutely required that unit 13 is mechanically or structurally disposed on part 9. Therewith optimally short connections 21 are obtained between unit 13 and sensors or adjusting elements 11 and in particular, the potential difference or the voltage $U_4$ ($\phi_9$ minus $\phi_0$) does not interfere with the signals transmitted therein. Therewith a substantial increase of the measuring or adjusting accuracy is realized since it is no longer necessary to process on unit 13 small adjusting or measuring signals superimposed onto "Common Mode" signals. Thus, the signal processing can take place free of interference on unit 13, and low-power signals thereon can be amplified to high level such that a succeeding routing, in particular outputting of corresponding signals from chamber 1 becomes substantially less problematic. The connection of at least one portion of signals between unit 13 and a unit outside of the vacuum chamber 1, such as for example on the supervisory computers 17, takes place via a galvanic isolation device 30 shown schematically in FIG. 2, such as for example via a ratio transformer or via light waveguides or optocouplers.

Figure 3:
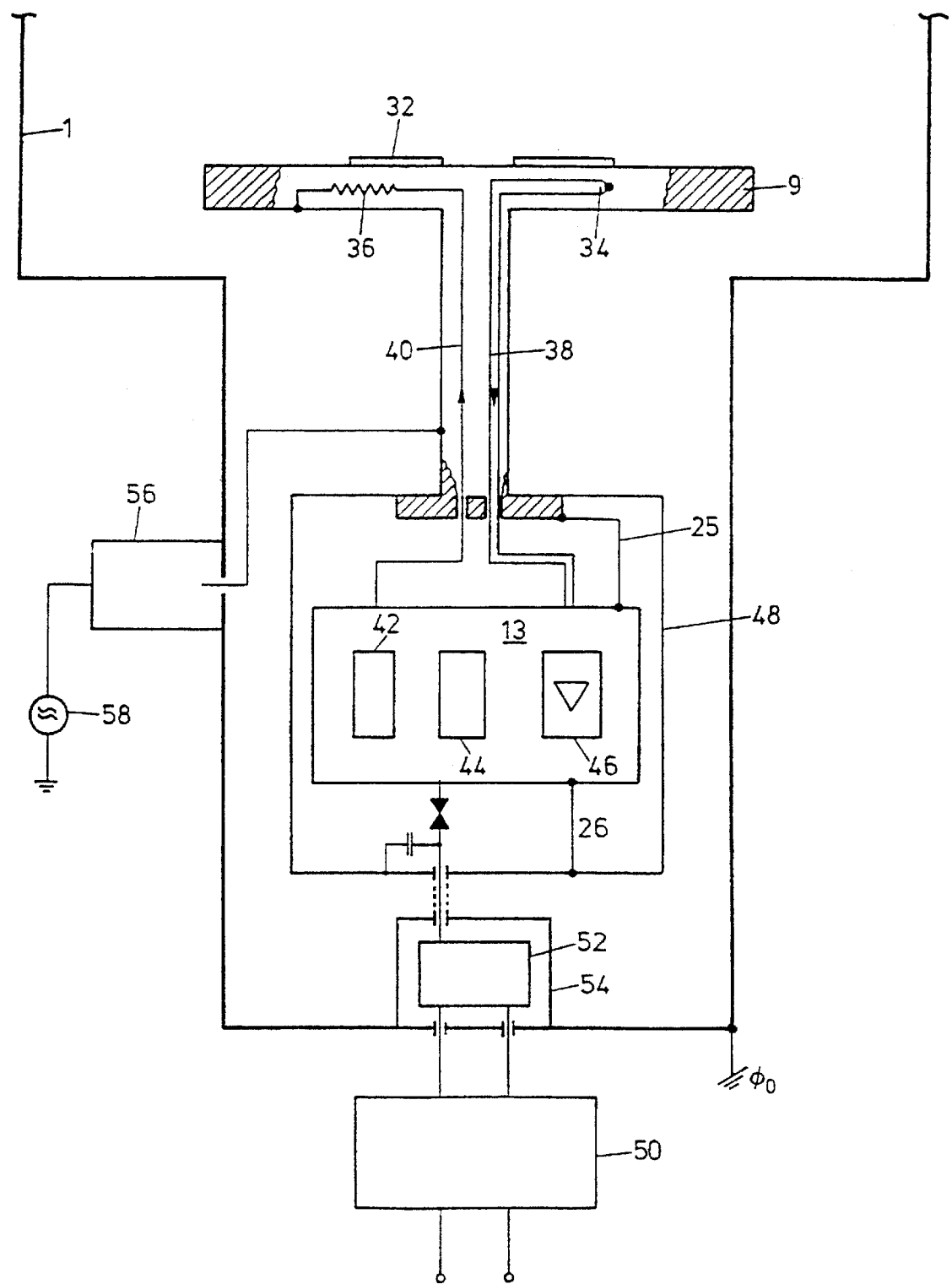

In FIG. 3 a segment of a preferred system according to the invention is shown in detail. Here, the part 9 is used as a discharge electrode $3_a$, $3_b$ shown in FIGS. 1 and 2, for an HF plasma discharge. This part 9 forms simultaneously according to FIG. 3 substrate supports for substrates 32 to be treated in chamber 1. Part 9 will now be referred to as a substrate support 9. As the sensor on substrate support 9 a thermosensor 14 is installed, as adjusting element for the temperature a thermal resistor configuration 36. Measuring signal line 38 from the sensor configuration 34 or adjusting signal lines 40 to the actuator device 36 are carried to the electronics unit 13 which comprises a microprocessor with storage unit for operating programs. Apart from said microprocessor are disposed, for example in unit 13 an adjusting element control final stage 42, for example with corresponding digital/analog converter, a voltage supply unit 44 for the total unit 13, a measuring signal amplifier input stage 46 with corresponding analog/digital converter.

The unit 13, as shown with the galvanic connection 25 (that is metallically connected), is operated at the electric potential of the substrate support 9. Furthermore, preferable the unit 13 is encompassed, as shown with the galvanic connection 26, by a Faraday cage 48 operated at the potential of the substrate support 9. Output signals from unit 13 which are carried out of the chamber 1, which is at the system reference potential $\phi_0$, i.e. ground potential, as well as input signals which are supplied to unit 13 from outside of chamber 1 are carried at least in part via a galvanic isolation unit 50, as stated via ratio transformer and/or via light waveguides or optocouplers. Preferably additionally an HF filter configuration 52 is provided between galvanic isolation unit 50 and electronics unit 13. The filter configuration 52 is preferably disposed in a Faraday cage 54 which is operated at the system reference potential $\phi_0$. Corresponding to the operating frequency range, throughguides through the Faraday cage 48 or 54 are limited in terms of their diameter. As one of the HF plasma discharge electrodes, for example operated at 13.56 MHz, the substrate support 9 is connected via a matchbox 56 with the HF generator 58 for the HF plasma discharge.

Throughguides, for example for electric energy, a cooling or heating medium, etc., through the Faraday cage 48 have said frequency range diameter of maximally 5 cm, preferably of less than 1 cm. The voltage supply of unit 13 also takes place preferably via a galvanic isolation on unit 50 and via corresponding filters of the filter configuration 52.

If with the sensor/actuator configuration depicted in FIG. 3 the system is operated according to the known principle shown in FIG. 1 or as shown in FIG. 3, at the system constellation according to the invention accuracies higher by a factor of at least 10 are attained.

Figure 4:
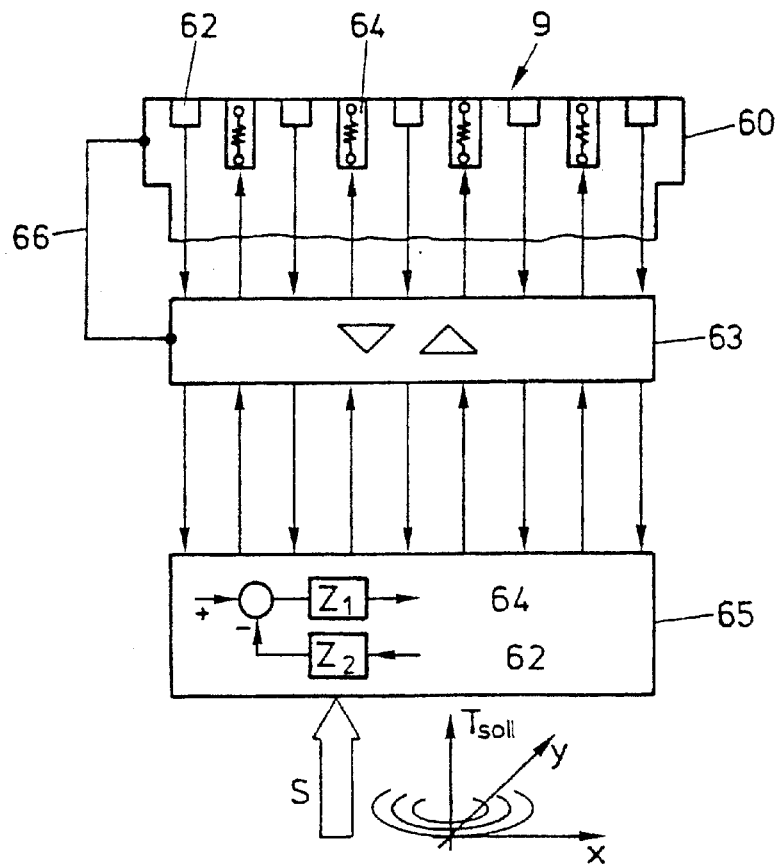

In FIG. 4 is shown schematically in partial view a further preferred embodiment of the system according to the invention. On a workpiece support table 60, for example an elevating table, are disposed in the form of a matrix a multiplicity of sensors 62 or of heating and/or cooling elements 64. The output signals of sensors 62 are carried to the electronics unit 63. The electronics unit 63 is therein, as shown with the galvanic connection 66, placed at the potential of the workpiece holder table 60 acting as part 9. The output signals of sensors 62 are amplified in the electronics unit 63 in terms of a drastic increase of the succeeding signal-to-noise ratio and at the output side transmitted to an electronics unit 65 succeeding unit 63 and preferably disposed outside of the vacuum chamber. Conversely, the output signals of the supervisory electronics unit 65 back to the electronics unit 63 placed at potential according to the invention which routes them further, after adaptation in terms of signal and/or impedance, to the heating and/or cooling elements 64. To the supervisory electronics unit 65 the input signals from sensors 62 are for example compared in their totality with a, as shown schematically at S set temperature distribution input into unit 65 along the workpiece support table 60 and, in terms of a regulation at the unit 65 the set value/instantaneous value comparison is carried out and the transmission elements $Z_1$ or $Z_2$ formed with the corresponding characteristic.

Figure 5:
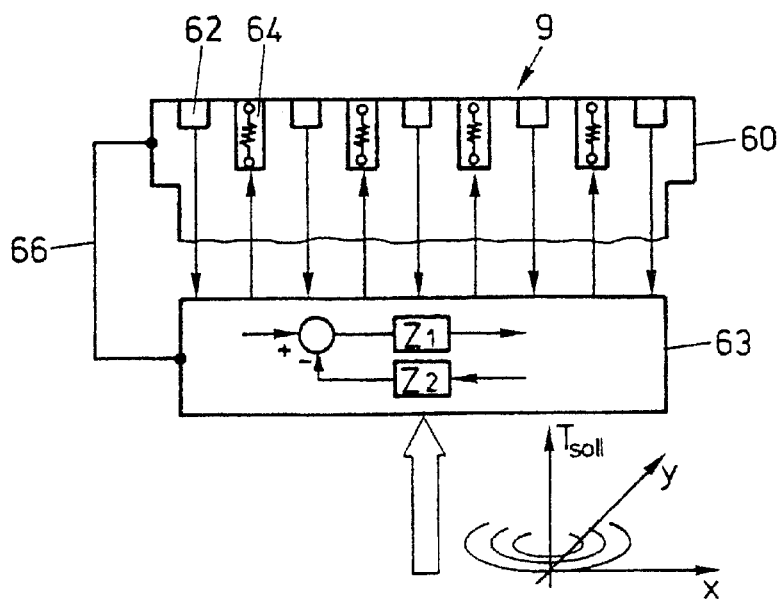

According to FIG. 5 in which identical parts are denoted by the same reference symbols as in FIG. 4, the electronics unit 63 forms directly set value/instantaneous value difference and regulating elements corresponding to $Z_1$ and $Z_2$. Here the desired temperature distribution $T_{SET}$ is directly fed to the electronic unit 63, placed at potential according to the invention, or stored in it.

A person skilled in the art recognizes readily that, analogously the temperature or temperature distribution or generally the conditions on further parts of the system can be detected and, if necessary, be regulated, thus in particular on a target configuration.

Figure 6:
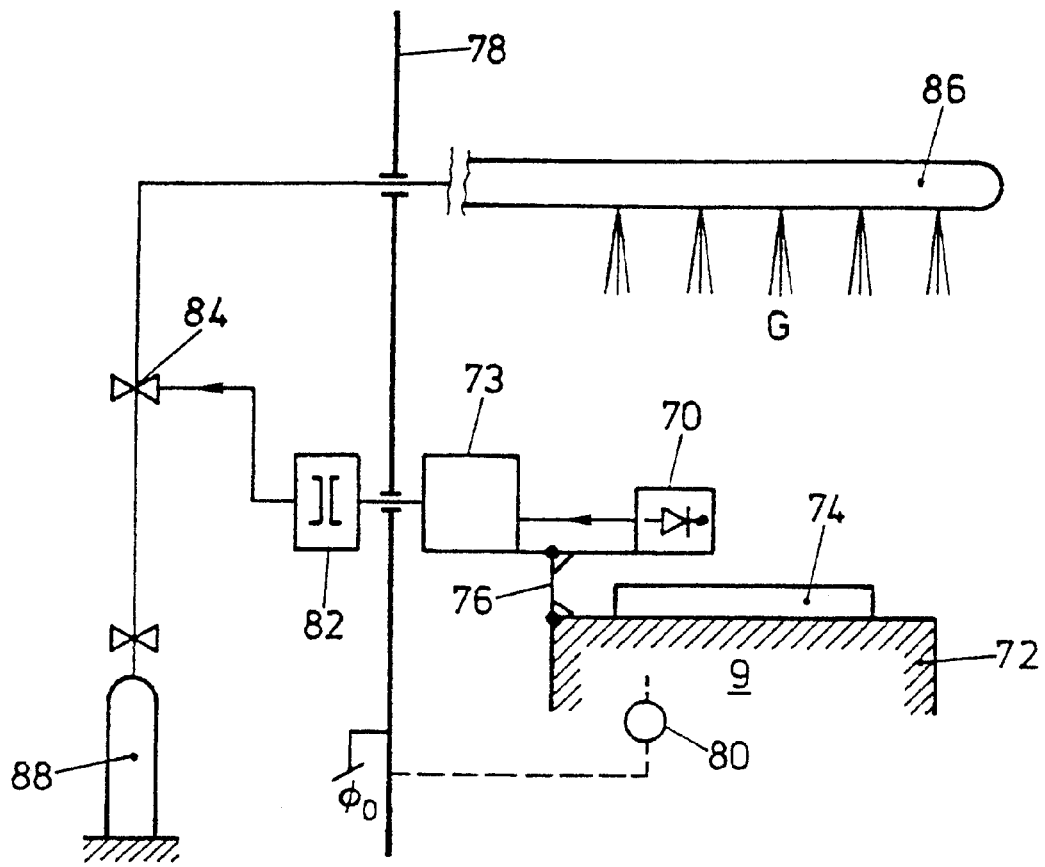

In FIG. 6 a further preferred system according to the invention is shown schematically. For example, for carrying out a CVD or PECVD surface treatment process a gas sensor 70 is disposed in the region of a workpiece 74 placed onto a workpiece support table 72. The evaluating electronics unit 73, as shown schematically with the galvanic connection 76, together with the sensor 70 is placed at the potential of the table 72, here acting as the part 9. As has already been the case with the workpiece support table 60 according to FIGS. 4 and 5, the workpiece support table 72, depending on the treatment process carried out can here also be placed at a desired bias potential, be this a DC and/or an AC potential, as is shown in FIG. 6 schematically with a source 80 and the dashed-line connections, with respect to the ground potential applied as reference potential $\phi_0$ to the wall 78 of the vacuum chamber.

Via a galvanic isolation unit 82 the electronics unit 73 adjusts a valve configuration 84 which provides and preferably regulates the gas flow G from a gas tank 88 and from a gas injection 86.

The process according to the invention is used especially preferably in the case of vacuum treatment systems in which plasma discharges are realized such as in particular in reactive or nonreactive sputtering coating or sputter etch treatment systems or in plasma-enhanced CVD treatment systems, but, if appropriate also in arc vaporization systems or electron beam vaporization systems, generally in the case of systems in which precise measurements or precise adjusting interventions are required where in operation and with respect to system reference potential high voltages can obtain or occur.

Therewith through the process according to the invention the possibility is given to detect small signals with an accuracy only limited through the measuring electronics in unit 13'. A system which is laid out for the same measuring or adjusting requirements according to prior known process according to FIG. 1, is at the order of magnitude of a factor 3 to 4 more expensive than when following the technique according to the invention as explained in conjunction with FIGS. 2 or 3.

What is claimed is:

1. A vacuum treatment system with at least one vacuum treatment chamber, a first part of said system being connected to an electric system reference potential, a second part of said system within said chamber, being in operation of the system, operated at a further electric potential being different from said system reference potential by at least an absolute difference value of 12 V, at least one of a sensor and of an adjusting element with an electric signal connection mounted on said second part, said connection being operationally connected to an electric signal connection of an electronic unit, said electronic unit having a reference connection for an electric unit reference potential, said reference connection being metallically connected to said second part so as to maintain said reference connection during operation on said further electric potential, said electronic unit being within said vacuum chamber.

2. The vacuum system of claim 1, further comprising a plasma discharge arrangement generating within said chamber a plasma discharge and wherein said second part is mounted in an electrically floating manner.

3. The system of claim 1, wherein said second part is connected to a predetermined electric potential.

4. The system of claim 1, further comprising a discharge arrangement with at least one discharge electrode within said chamber, said second part being said electrode.

5. The system of claim 1, further comprising a workpiece carrier within said chamber said workpiece carrier being said second part.

6. The system of claim 1, wherein said sensor is a temperature sensor.

7. The system of claim 1, wherein said adjusting element is at least one of a heating and of a cooling arrangement.

8. The system of claim 1, wherein said adjusting element is at least one of a multiple-zone heating and cooling arrangement.

9. The system of claim 1, further comprising a workpiece carrier within said chamber, said sensor detecting presence or absence of a workpiece on said workpiece carrier.

10. The system of claim 9, said substrate carrier further comprising holding members for workpieces acting electrostatically or by means of suctioning pressure on workpieces, said sensor monitoring said holding members.

11. The system of claim 1, further comprising a gas inlet into said chamber, said sensor being a gas flow sensor with an output operationally connected to an input of said electronic unit, said electronic unit having an output operationally connected with a control input of an adjusting member being a gas supply line to said gas inlet.

12. The system of claim 1, wherein said second part is a target arrangement and said sensor senses a condition of said target arrangement.

13. The system of claim 12, wherein said condition is target temperature.

14. The system of claim 1, wherein said electronic unit comprises a digital unit.

15. The system of claim 1, wherein said electronic unit comprises a programmable digital unit.

16. The system of claim 1, wherein said electronic unit comprises a digital processing unit.

17. The system of claim 16, wherein said digital processing unit comprises a microprocessor or microcomputer with storage for operating software.

18. The system of claim 1, wherein said further electric potential is one of an AC potential and of a DC potential.

19. The system of claim 18, wherein said AC potential is RF or microwave potential.

20. The system of claim 1, wherein said second part is a substrate carrier.

21. The system of claim 1, wherein said further electric potential has a frequency between 100 kHz and 100 MHz.

22. The system of claim 21, wherein said frequency is between 5 MHz and 50 MHz.

23. The system of claim 22, wherein said frequency is at least approximately 13.56 MHz.

24. The system of claim 1, wherein said difference value Vpp is 25 V≦Vpp≦2000 V.

25. The system of claim 24, wherein said difference value is 50 V≦Vpp≦500 V.

26. The system of claim 1, wherein said electronic unit is mounted on said second part.

27. The system of claim 1, wherein said electronic unit is mounted within a Faraday cage.

28. The system of claim 1, said electronic unit comprising an output being operationally connected to an input of at least one of an adjusting and of a monitoring unit.

29. The system of claim 1, said electronic unit having an output operationally connected with a computer.

30. The system of claim 1, said electronic unit having an output operationally connected to an input of a further electronic unit via a galvanically separated link.

* * * * *